United States Patent [19]

L'Allemand

[11] 4,277,298

[45] Jul. 7, 1981

[54] METHOD OF MAKING A HOLLOW ARTICLE

[75] Inventor: Charles C. L'Allemand, Murray Hill, N.J.

[73] Assignee: The Cly-Del Manufacturing Company, Waterbury, Conn.

[21] Appl. No.: 625,472

[22] Filed: Oct. 24, 1975

Related U.S. Application Data

[63] Continuation of Ser. No. 372,917, Jun. 25, 1973, abandoned, which is a continuation-in-part of Ser. No. 350,775, Apr. 13, 1973, abandoned.

[51] Int. Cl.³ .................. B21D 22/00; B21D 39/00
[52] U.S. Cl. .................. 156/199; 29/DIG. 11; 72/347; 174/35 TS; 228/155
[58] Field of Search .................. 156/3, 163, 164, 196, 156/198, 199, 202, 203, 212, 217, 224, 228, 233, 258, 297, 299, 301, 311, 324, 459, 469, 555, 580–583; 428/35, 457, 458, 421; 29/608, 609, 472.9, 480, 445, DIG. 11; 174/35 MS, 35 TS, 110 FC; 220/64; 264/320, 322; 425/DIG. 55; 72/347–351; 228/155

[56] References Cited

U.S. PATENT DOCUMENTS

| | | | |
|---|---|---|---|
| 2,313,379 | 3/1943 | Wood | 174/35 TS |
| 3,008,601 | 11/1961 | Cahne | 220/64 |
| 3,028,667 | 4/1962 | Wintermute et al. | 29/472.9 |
| 3,376,920 | 4/1968 | Lazarus | 174/35 TS |
| 3,421,972 | 1/1969 | Cromwell et al. | 161/218 |
| 3,676,566 | 7/1972 | McBride | 174/36 |
| 3,703,428 | 11/1972 | Poling et al. | 29/472.9 |
| 3,767,500 | 10/1973 | Talley et al. | 156/184 |
| 3,799,832 | 3/1974 | Reick | 428/421 |
| 3,938,725 | 2/1976 | Hardwick | 228/155 |

Primary Examiner—John E. Kittle
Attorney, Agent, or Firm—Lerner, David, Littenberg & Samuel

[57] ABSTRACT

A method of making a hollow article with a fluorocarbon layer bonded thereto.

13 Claims, 9 Drawing Figures

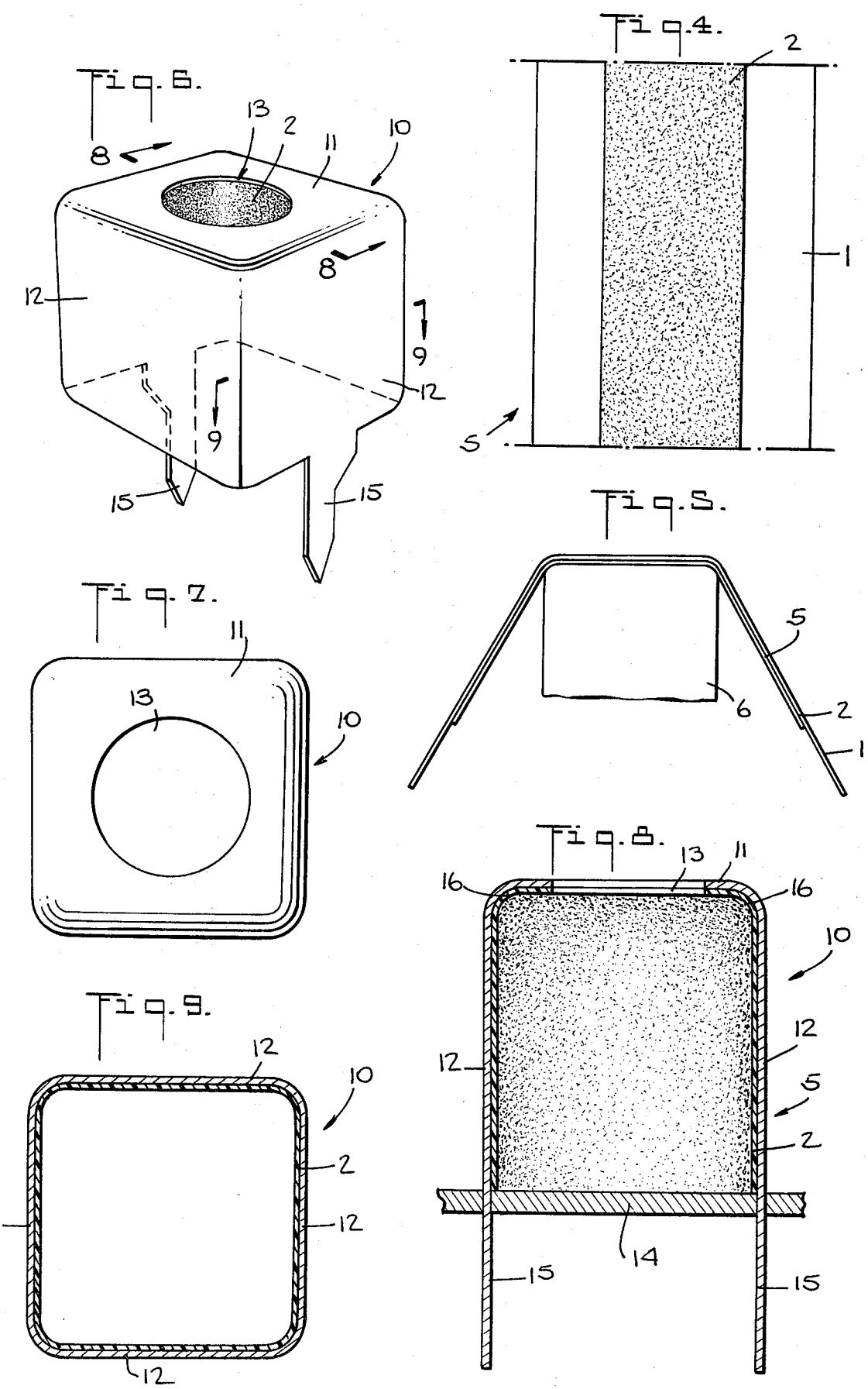

METHOD OF MAKING A HOLLOW ARTICLE

This application is a continuation of pending U.S. application Ser. No. 372,917, filed June 25, 1973 now abandoned, which application Ser. No. 372,917 is a continuation in part of application Ser. No. 350,775, filed Apr. 13, 1973 and entitled "Electronic Shields," now abandoned.

DESCRIPTION

The present invention is directed to an improved method of making a hollow article and more particularly to an improved method of making a hollow article with a plastic laminate bonded thereto.

The present invention also envisions its use in making hollow objects which have a layer of material bonded thereto which may be used as electronic shields, valves, and other hollow articles.

Pending patent application Ser. No. 350,775 filed Apr. 13, 1973 is directed to an electronic shield for electronic assemblies. In that application, the plastic laminate is bonded to the inner surface and acts as an insulation.

The present invention has for one of its objects an improved method of making a hollow article which is drawn with a laminate layer bonded thereto so that the laminate is uniformly distributed throughout the surface of the article.

Another object of the present invention is the provision of an improved method of making a hollow article in which the laminate layer may be drawn without cracking and without disturbing the adhesion between the metal and the laminate.

Another object of the present invention comprises an improved method of making a hollow article which has a layer of plastic material bonded thereto.

Another object of the present invention is an improved method of making a hollow article which has a layer of material fusion-bonded thereto throughout its entire surface area.

Another object of the present invention is the provision of an improved method of making a hollow article which has a plastic material extending uniformly throughout its entire area.

Another object of the present invention is the provision of an improved method of making a hollow article which has a coating without any ruptures, cracks or voids therein.

Another object of the present invention is an improved method of making a hollow article which is coated with a plastic coating. The coating can be Teflon or any other plastic material suitable for the application requirements.

Other and further objects of the invention will be obvious upon an understanding of the illustrative embodiment about to be described, or will be indicated in the appended claims, and various advantages not referred to herein will occur to one skilled in the art upon employment of the invention in practice.

For ease, the present invention will be described in connection with the making of an electronic shield such as that shown in pending application Ser. No. 350,775 filed Apr. 13, 1973. In using the present invention to make that particular electronic shield, the laminate is a plastic Teflon layer which is fusion bonded to the inner surface of the hollow shield. However, it will be understood that the present invention may be used for making any hollow article and may be used whether the hollow article has a layer bonded to the inner surface or has a layer bonded to the outer surface thereof. In this application, any reference to an electronic shield is to be interpreted as being applicable to any hollow article.

A preferred embodiment of the invention has been chosen for purposes of illustration and description and is shown in the accompanying drawings forming a part of the specification, wherein:

FIG. 4 is a plan view of the laminated sheet;

FIG. 5 is a diagrammatic view showing the manner in which the sheet of FIG. 4 is drawn by a drawing tool in order to form a shield;

FIG. 6 is a perspective view of the finished shield;

FIG. 7 is a top view of the shield;

FIG. 8 is a sectional view taken along line 8—8 of FIG. 6; and

FIG. 9 is a sectional view taken along line 9—9 of FIG. 6.

Figure 1:
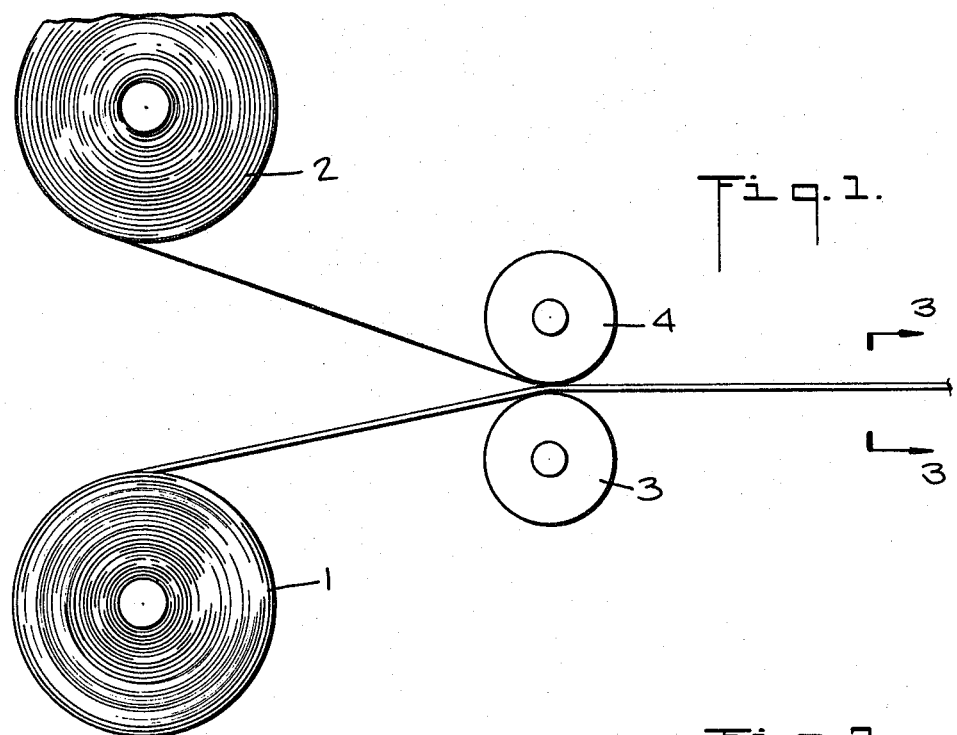
FIG. 1 is a diagrammatic view of the method of laminating a sheet of metal with a shielding laminate.

Stein U.S. Pat. No. 3,107,197 describes a method of bonding a plastic coating to a metal. In that patent, the use of such a laminate for low value capacitors and hermetically sealed terminals is described in this patent and also the formation of hermetic seals for electrical components.

However, the Stein patent does not describe the method of making hollow articles made from a laminate comprising a hollow metal article made of copper, for example, and an inner layer of coating material, such as fluorocarbon plastic. In addition, this earlier patent also requires the use of an oxide between the laminate layer and the metal.

The present invention comprises an improved method of making a hollow article, such as an electronic shield, having a continuous coil of fusion-bonded laminate which is pressed or drawn into a hollow shape or can in a series of single press operations such drawing operations are well known in the art, as exemplified by U.S. Pat. No. 3,703,428. A drawing operation such as the one which may preferably be used herein is described in a book entitled "22 Ways to Build a Complete Production Line" published by Waterbury Farrel, a Division of Textron Inc. in 1968. The fusion-bonded laminate retains its bond strength and insulation properties when it is being formed so that the metal and the film laminate are an integral part of each other.

The fusion-bonded laminate permits a fluorocarbon plastic material, preferably, such as Teflon, which is the Dupont trademark for tetrafluoroethylene resin and which is described in detail in said Stein U.S. Pat. No. 3,107,197 to be used as the bonded layer. Since the metal and the laminate are strongly bonded together, there is little or no slippage between the two layers so that the thickness of the plastic laminate will not be materially affected during the drawing operation. In the forming and drawing process the pressure exerted by the dies slightly compresses the plastic laminate. However, the memory or resiliency of the plastic laminate causes it to return to its original thickness. Hence, a relatively uniform layer is provided throughout the entire surface area. Furthermore, cracking or creation of voids in the laminate or separation of the plastic layer from the metal shield is virtually eliminated.

Preferably, the plastic laminate layer is deposited on the matte or roughened surface of the metal. Such matte or roughened surfaces are well known in the art and can be formed electrolytically, as exemplified by Stein U.S. Pat. No. 3,197,197 or mechanically, as exemplified by U.S. Pat. No. 3,421,972 or chemically, as exemplified by U.S. Pat. 3,008,601. A laminating process which may preferably be used herein is shown in U.S. Pat. No. 3,767,500. This aids in preventing delamination during the drawing of the hollow article and also prevents areas of the plastic from slipping and becoming thinned out in gauged thickness. With this product, a combined hollow article with an insulation layer or film having a thickness which is substantially uniform through its entire area is produced.

Figure 2:
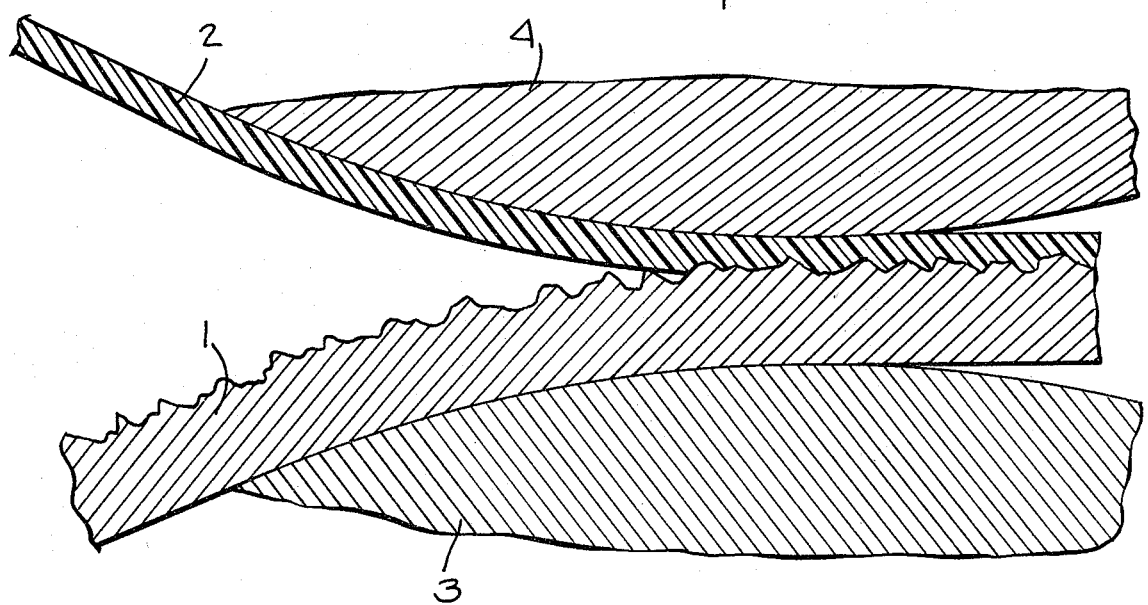
FIG. 2 is an enlarged detail thereof.
Figure 3:
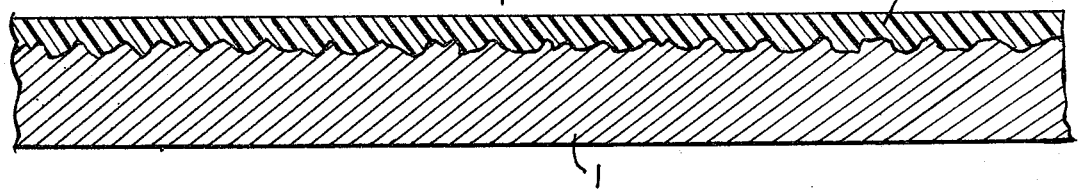
FIG. 3 is a section of the laminated product.

Referring more particularly to the drawing which are specifically directed to an electronic shield, the method of laminating the shield of the present invention is shown in FIGS. 1 to 3 and comprises a web of metal 1, preferably such as copper and a web of insulating material 2, such as Teflon, pressed between pressure rollers 3 and 4, so that they combine together into a laminated product 5 as shown in FIG. 4. The pressure rollers 3 and 4 are preferably heated and adapted to apply a predetermined amount of pressure. The resulting laminate 5 has a firm bond between the Teflon 2 and the metal.

In FIG. 2 it will be noticed that preferably the matte or roughened side of the copper 1 is used so that the Teflon 2 is pressed into the ridges in the metal 1 and is held in place as shown in FIG. 3. With this construction, the Teflon 2 may stretch without being pulled away from the metal 1 and without cracking. Furthermore, in stretching, the thickness of the coating remains substantially uniform throughout because the stretching is substantially uniform.

The laminated structure 5 is then stamped out to the desired shape and drawn into a finished shield as shown in FIG. 6 by a series of drawing steps which is shown schematically in FIG. 5 and which includes a drawing die 6. In drawing the laminated structure 5, the Teflon lining 2 is stretched in a uniform manner, as outlined above, so that it does not crack at the corners nor along the edges and it remains substantially uniform throughout its area.

If it is desired that a certain portion of the sheet 5 be without Teflon, then the Teflon is applied to only a part of the metal. As an example of this, reference is made to FIG. 4 where the Teflon 2 is laminated along the longitudinal center of the sheet 1 and the spaced edges of the copper sheet remains free of Teflon. This is particularly useful in drawing the particular shield shown in FIGS. 6 to 9 where the pins 15 are free of Teflon.

The finished shield 10 made by the present method is shown in the drawing at FIGS. 6 to 9 and comprises a top wall 11 and a plurality of side walls 12. An opening 13 is provided in the top wall 11 and a pair of anchoring pins 15 depend from opposed side walls 12 to permit the shield to be assembled on a circuit board 14 by soldering or some other similar method.

Preferably, the inner copper surface 5 of the shield 10 is covered with the laminate of insulation film 2 which is preferably a plastic material. The insulation laminate 2 is of a substantially uniform thickness throughout the entire shielding area of the shield including the corners 16 of the shield. The insulation layer 2 does not have any cracks, voids or ruptures at all through its entire surface and is firmly anchored to the inner surface of the shield throughout its area. The anchoring pins 15 have the coating removed therefrom.

The inner surface of the copper being preferably matte or roughened will permit the layer of insulation 2 to be bonded to it and remain bonded to it during the drawing operations as in FIG. 5 so that delamination, slippage and thinning out is virtually eliminated. The metal shield 10 and its insulating film 2 are bonded together in such a manner that the thickness of the laminate is relatively uniform throughout the entire shielding area.

It will be seen that the present invention provides an improved method of making a hollow article which has a layer bonded to the surface of the metal article which is uniform and which is formed without the laminated surface cracking or delaminating during the drawing operation.

As many and varied modifications of the subject matter of this invention will become apparent to those skilled in the art from the detailed description given hereinabove, it will be understood that the present invention is limited only as provided in the claims appended hereto.

Having thus described my invention, I claim:

1. A method of making a housing for electronic components comprising the steps of:
    providing a stock of first material;
    applying a layer of second material to said stock of first material to form a composite structure, the layer of second material being applied so that said composite structure is devoid of said second material at a predetermined zone thereof; and
    forming a housing having at least one anchoring member and a cup-like body from said composite structure, the forming step being controlled to locate said at least one anchoring member of said housing in the portion of said composite structure which includes said predetermined zone devoid of said second material and to locate said cup-like body of said housing in the portion of said composite structure having said layer of second material applied to said stock of said first material so that said at least one anchoring member remains free of said second material.

2. The method of claim 1 wherein said forming step comprises drawing said composite structure in a series of press operations into said housing.

3. The method of claim 1 wherein said step of applying comprises depositing said layer of second material onto a surface of said stock of said first material and bonding said layer of second material to said stock of first material to form a laminated composite structure.

4. The method of claim 3 wherein said step of depositing comprises depositing said layer of second material onto a roughened surface of said stock of said first material.

5. The method of claim 4 wherein said step of bonding comprises fusion bonding said layer of second material to said stock of first material.

6. The method of claim 3 wherein said layer of second material is of a substantially uniform thickness on said stock of first material.

7. The method of claim 6 wherein said layer of second material is substantially continuous throughout said portion of said composite structure from which said cup-like body of said housing is formed.

8. The method of claim 5 wherein said first material comprises an electrically conductive material and wherein said second material comprises an electrically insulating material.

9. The method of claim 8 wherein said first material comprises a metallic material and wherein said second material comprises a ploymeric material.

10. The method of claim 1 in which said housing includes a pair of anchoring members; wherein said layer of second material is applied to said stock of first material so that said composite structure is devoid of said second material at a pair of predetermined zones thereof; and wherein said forming step is controlled to locate said anchoring members in respective portions of said composite structure which include respectively said pair of predetermined zones devoid of said second material.

11. The method of claim 10 wherein said first material comprises an electrically conductive material and wherein said second material comprises an electrically insulating material.

12. The method of claim 11 wherein said electrically conductive first material comprises a metallic material, and wherein said electrically insulating second material comprises a fluorocarbon plastic material.

13. The method of claim 12 wherein said metallic material is copper and wherein said fluorocarbon plastic material is teflon.

* * * * *